United States Patent [19]

Vinegar et al.

[11] Patent Number: 4,728,892

[45] Date of Patent: Mar. 1, 1988

[54] NMR IMAGING OF MATERIALS

[75] Inventors: Harold J. Vinegar, Houston; William P. Rothwell, Katy, both of Tex.

[73] Assignee: Shell Oil Company, Houston, Tex.

[21] Appl. No.: 765,406

[22] Filed: Aug. 13, 1985

[51] Int. Cl.$^4$ .............................................. G01R 33/20
[52] U.S. Cl. ...................................... 324/309; 324/303
[58] Field of Search ................ 324/303, 306, 307, 309

[56] References Cited

U.S. PATENT DOCUMENTS

| | | | |
|---|---|---|---|
| 4,291,271 | 9/1981 | Lauffer | 324/303 |
| 4,297,637 | 10/1981 | Crooks et al. | 324/309 |
| 4,471,305 | 9/1984 | Crooks et al. | 324/309 |
| 4,564,811 | 1/1986 | Walker | 324/307 |
| 4,573,014 | 2/1986 | Riederer | 324/307 |
| 4,583,044 | 4/1986 | Case et al. | 324/309 |

OTHER PUBLICATIONS

Timur, A., "Pulsed Nuclear Magnetic Resonance Studies of Porosity, Movable Fluid, and Permeability of Sandstones", J. of Petroleum Technology, Jun., 1969.
On the Interpretation of Water Nuclear Magnetic Resonance Relaxation Times in Heterogeneous Systems, Glasel, J. A. and Lee, K. A., Jour. Am. Chem. Soc., vol. 96 (1974), pp. 970–978.
An Investigation of Shear Strength of the Clay-Water System by Radio-Frequency Spectroscopy, Pickett, A. G. and Lemcoe, M. M., Jour. Geophysical Research, vol. 64, No. 10 (1959), pp. 1579–1585.
Loren et al., "Relations Between Pore Size Fluid and Matrix Properties, and NML Measurements", Society of Petroleum Engineers Journal, Sept. 1970, pp. 268–278.
Telford et al., *Applied Geophysics*, (Cambridge University Press, New York), 1976, pp. 774, 775, 802.

Primary Examiner—Stewart J. Levy
Assistant Examiner—Kevin D. O'Shea

[57] ABSTRACT

NMR imaging methods are provided for determining the spatial petrophysical properties of materials. These methods employ the generation of separate $M_o$, $T_1$ and $T_2$ images from which various petrophysical characteristics may be obtained, such as free fluid index, porosity, pore sizes and distributions, capillary pressure, permeability, formation factor and clay content.

8 Claims, 7 Drawing Figures

NMR IMAGING OF MATERIALS

BACKGROUND OF THE INVENTION

This invention relates to Nuclear Magnetic Resonance, and more specifically relates to Nuclear Magnetic Resonance Imaging.

Nuclear Magnetic Resonance (NMR) is well established as an analytical tool, and applications of NMR in the field of petrophysics have included well logging and laboratory measurements of free-fluid index, residual oil saturation, and permeability. These applications are based on NMR measurements of bulk nuclear spin density and various bulk spin relaxation times.

A relatively recent development in NMR is the technique of NMR Imaging, NMRI. In 1973, Lauterbur (P. C. Lauterbur, Nature, Vol. 242, Mar. 16, 1973, pp. 190–191) demonstrated that by applying controlled magnetic field gradients, the spatial distribution of hydrogen-containing fluids could be mapped with NMR. NMRI has been mostly employed in the field of medical imaging to provide a physician with the ability to discriminate between various normal and abnormal tissues. Nonmedical applications of NMRI, however, are just now being investigated.

Although NMR has been employed to measure some bulk petrophysical properties of materials, it has not been employed to determine the spatial variation of petrophysical properties. Further, most conventional methods for measuring the bulk petrophysical properties of a material do not employ NMR techniques but employ techniques that attempt to directly measure the petrophysical property and as a consequence are often time consuming and tedious. Some of these conventional techniques may introduce errors into the measurement because of the small size and number of most samples employed to make petrophysical measurements.

These and other limitations and disadvantages of the prior art are overcome by the present invention, however, and methods for nuclear magnetic reasonance imaging are provided for determining petrophysical properties of materials.

SUMMARY OF THE INVENTION

In a preferred embodiment of the present invention methods are provided for determining the petrophysical properties of materials with nuclear magnetic resonance imaging techniques.

Although a number of methods can be employed for producing NMR images, the presently preferred technique employs the projection reconstruction method introduced by Lauterbur. A linear magnetic field gradient is applied to the sample so that the resonant frequencies of the nuclear spins of the nuclei being imaged take on a spatial dependence. The resulting NMR spectrum then represents a projection of nuclear spin density perpendicular to the direction of the applied gradient. A two-dimensional NMR image may be produced by combining projections taken at different angles. The magnetic field gradients may be rotated electronically for each projection.

In this manner it is possible to obtain images of a sample. These images may be separated into an initial magnetization M(0) image and a $T_2$ (spin-spin relaxation time) image by appropriate manipulation of the raw data. In a similar manner a $T_1$ (spin-lattice relaxation time) image may also be obtained. From these separate images, various petrophysical properties may be determined. By allowing a paramagnetic ion to diffuse into the sample while imaging the sample and determining the three separate images (M(0), $T_1$, and $T_2$), additional petrophysical properties may be determined. Specifically, Free Fluid Index (FFI), capillary pressure curves, permeability, clay content, oil saturation, and formation factors may be determined by the methods of the present invention.

It is an object of the present invention to provide NMRI methods for measuring petrophysical properties of a material.

It is also an object of the present invention to provide NMRI methods for measuring the Free Fluid Index, capillary pressure, permeability, clay content, oil saturation, and formation factor of a material.

These and other objects, features and advantages of the present invention will become apparent from the following detailed description, wherein reference is made to the Figures in the accompanying drawings.

DETAILED DESCRIPTION OF THE INVENTION

A number of methods may be employed for producing NMR images. The presently preferred technique employs the projection reconstruction method introduced by Lauterbur, which applies a linear magnetic field gradient to the sample so that the resonant frequencies of the nuclear spins of the nuclei being imaged take on a spatial dependence. The resulting NMR spectrum then represents a projection of nuclear spin density perpendicular to the direction of the applied gradient. A two-dimensional NMR image is produced by combining projections taken at different angles. The magnetic field gradients may be rotated electronically for each projection, or alternatively may be mechanically rotated by rotating the appropriate gradient magnet coil.

In order to obtain a spatially resolved image, the gradient-imposed spread in NMR frequencies, $(\Delta\chi)*(\gamma G)$, must dominate the natural spread in frequencies embodied in the normal linewidth, $(\Delta\nu_{\frac{1}{2}})$, i.e.

$$(\Delta\chi)*(\gamma G) > (\Delta\nu_{\frac{1}{2}}) \quad (1)$$

where $(\Delta\chi)$ is the spatial resolution, $\gamma$ is the gyromagnetic ratio of the nucleus, G is the gradient field strength, and $(\Delta\nu_{\frac{1}{2}})$ is the full width at half maximum of the NMR line in the absence of the applied gradient. Since $^1$H resonances of solids have natural linewidths on the order of 20 KHz, the solid portion of the sample is not imaged using normal NMR methods with typical gradient strengths. The NMR image will represent a selective mapping of spin density from only the protons of hydrogen-containing fluids or other preselected nuclei in the fluids in the sample.

Figure 1:
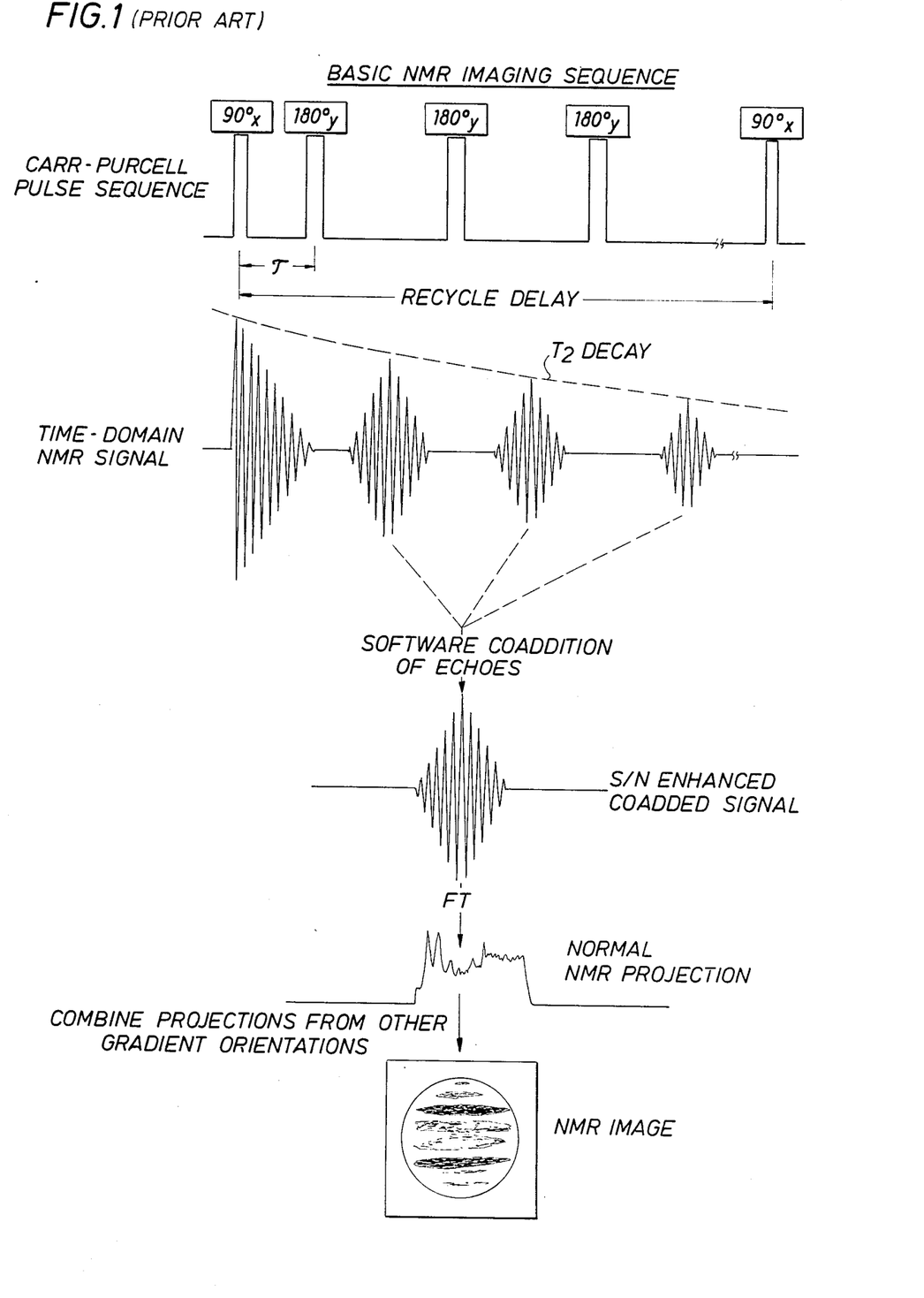
FIG. 1 depicts a simplified representation of a prior art method.

In a typical NMRI experiment, a Carr-Purcell pulse sequence (90-$\tau$180-2$\tau$-180 . . . ), where $\tau$ is the time interval between pulses, is used to excite the NMR signals (see FIG. 1). $T_2$ spin relaxation is responsible for the decay of the resulting spin echo train. The $T_2$ relaxation times of fluids in porous rocks have been found to be short and thus, short interpulse times ($\tau$=0.5 to 2 msec) are needed in the pulse sequence. Such $\tau$ times are considerably shorter than those used in medical NMR imaging. The short $\tau$ times are readily obtained using the projection reconstruction method which eliminates the need for gradient switching during acquisition. The time envelope of the spin echo decay, displayed in FIG. 1, is given by:

$$M(2t) = M(0) \exp(-2t/T_2) \quad (2)$$

where $M(0)$ is proportional to the spin density and $T_2$ is the spin-spin relaxation time. In prior art methods the separate echoes are stacked in a time-coherent fashion for signal enhancement. The resulting time-domain signal is then Fourier-transformed to obtain the spatial projection (FIG. 1).

In addition to normal $T_2$ mechanisms, spin-spin relaxation can also arise from molecular diffusion in a magnetic field gradient. Here, both applied gradients and possible "internal", magnetic-susceptibility-derived gradients must be considered. In either case, an additional term that is more complex for restricted diffusion must be included in Eqn. (2). These effects are minimized by choosing short $\tau$ times.

In quantitative petrophysical NMR imaging, it is important to measure $M(0)$ and $T_2$ independently for each pixel in the cross section. $M(0)$ images show the spatial distribution of fluid-filled porosity, i.e. Free Fluid Index, and $T_2$ images show the physical nature of the pores, e.g. pore size or clay content. A large $M(0)$ indicates higher fluid-filled porosity and a small $T_2$ may indicate smaller pore size or greater clay content.

Figure 2:
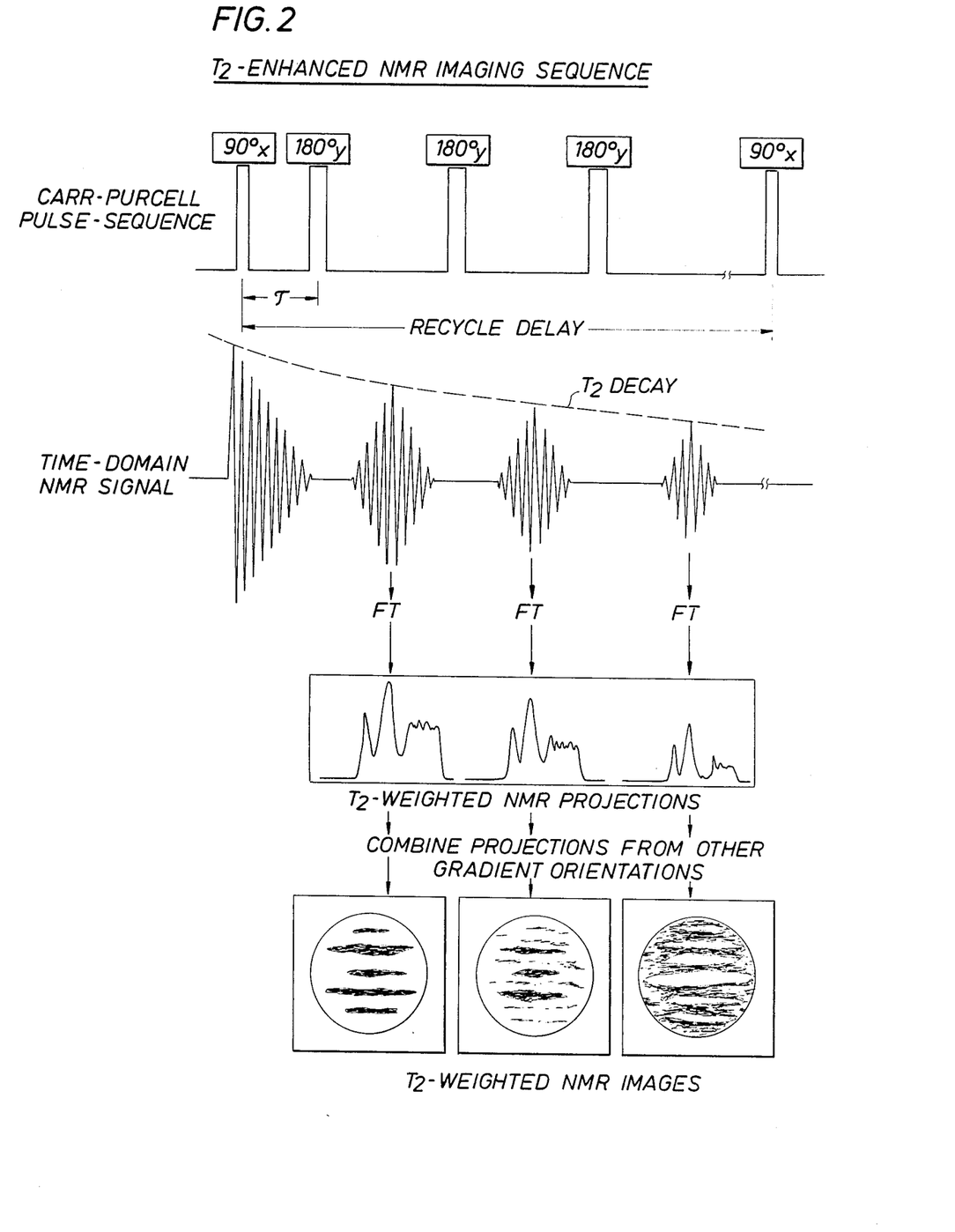
FIG. 2 depicts a simplified representation of a portion of the methods of the present invention.
Figure 3:
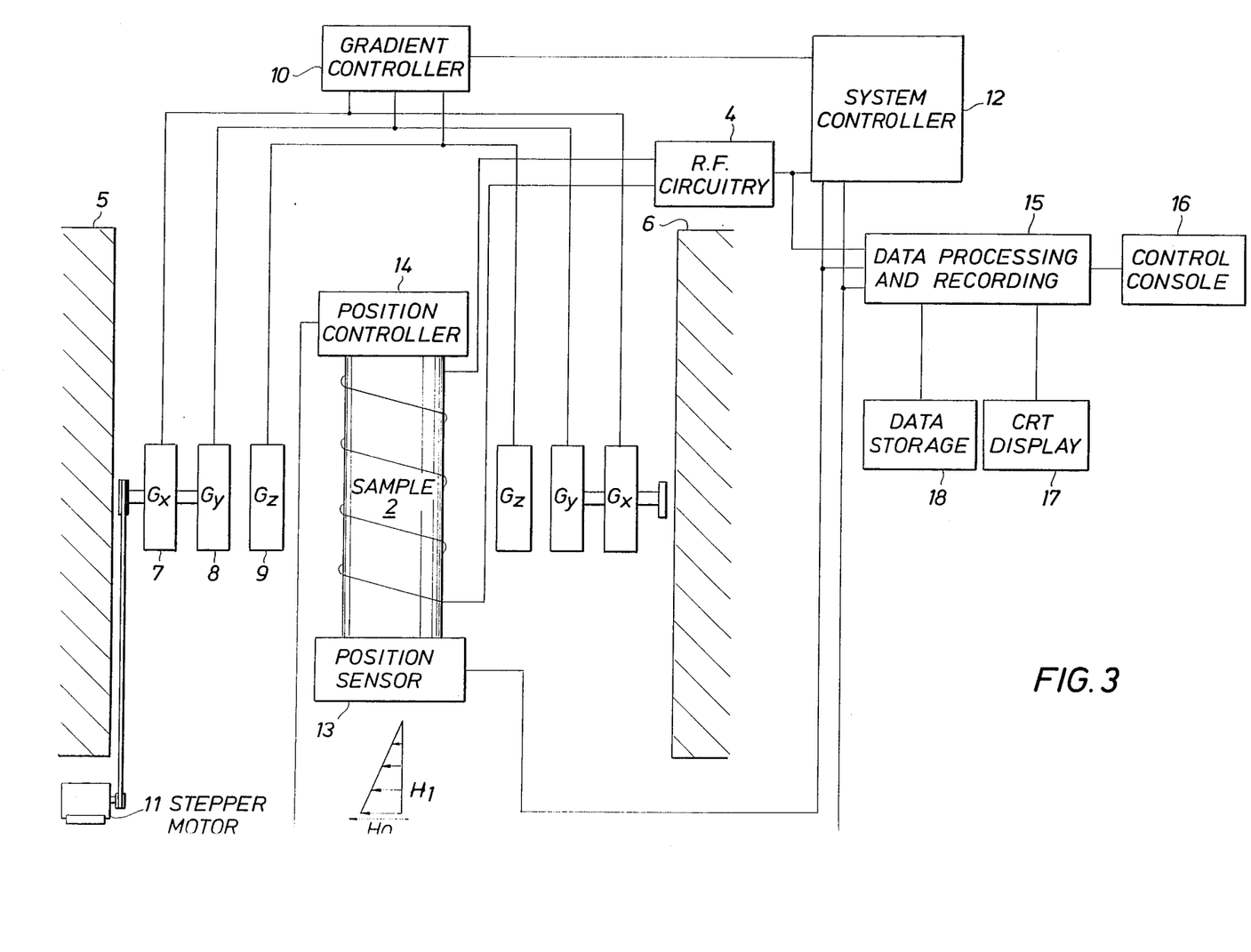
FIG. 3 depicts an apparatus suitable for employing the methods of the present invention.

To obtain independent $M(0)$ and $T_2$ imaging, the echoes are processed as in FIG. 2. A series of $T_2$-weighted NMR images, as shown at the bottom of FIG. 2, are separately fit to equation 2 for every pixel using a statistical technique such as a least squares method. Thus independent $M(0)$ and $T_2$ images are obtained. This may be performed by an appropriate computer associated with the NMRI apparatus or may be performed by a separate computer.

$T_1$ imaging may be done in a similar manner except that typically a RF prepulse is applied to the nuclear spin system to establish a nonequilibrium state. If the spin system is saturated by the prepulse, the magnetization response is given by:

$$M(t) = M(0)[1 - \exp(-t/T_1)] \quad (3)$$

where $T_1$ is the spin lattice relaxation time. Other pulse sequences may be employed. Images are obtained at different and increasing $\tau$ times, from which separate $M(0)$ and $T_1$ images may be computed as above. The $T_1$ images are representative of pore size and their distribution representative of pore size distribution. Generally, the amplitudes versus increasing times are "plotted" to give a composite exponential curve which may then be decomposed into multiple exponents. The amplitudes and time constants correspond to the proportion of pores of the size corresponding to that decay or time constant. The $T_2$ images may be similarly decomposed. See for example, "Relations Between Pore Size Fluid and Matrix Properties, and NML Measurements", Loren, J. D. and Robinson, J. D., Society of Petroleum Engineers Journal, September 1970, pp 268-278, which indicates:

The fraction of the initial proton magnetization remaining in a liquid confined in the pores of a solid matrix, whose mercury injection pressure is $P_c$, decays exponentially in time with a decay constant $1/T_1$, given by $$1/T_1 = r + \Gamma P_c, \quad (a)$$

where $r = 1/T_1$ of the bulk liquid and $\Gamma$ is a determined constant.

This equation applies to the response from a liquid confined within pores of uniform size. If there is a distribution in pore sizes, and $S_i$ is the fraction of the total pore volume in which $T_1 = (T_1)_i$, the fraction of proton magnetization remaining at time, t, for a sample with a distribution of pore sizes is $$F(t) = \sum_{i=1}^{n} S_i e^{-[r+\Gamma(P_c)_i]t} = \sum_{i=1}^{n} S_i e^{-t/(T_1)_i} \quad (d)$$

where $F(t)$ is the fraction of proton magnetization remaining at time t.

Such data define a complex exponential decay, as is expected for water confined in pores of various sizes. The data may be fit as the sum of multiple simple exponential decays. The coefficient of each component and the corresponding value of $T_1$ resulting from the fitting, together with an estimate of $\Gamma$ and the $T_1$ of the bulk fluid, permit a mercury injection capillary pressure histogram to be calculated from a simple model to relate the thermal relaxation time ($T_1$) of a liquidfilled porous solid to its geometrical and physical properties.

The ability to discriminate oil from water by NMRI is usually based on differences in relaxation times but chemical shifts may also be employed. For many systems relaxation time differences are inherently large enough to allow the desired discrimination. However, in cases where the oil viscosity and the pore sizes of the rock are such that similar relaxation times for the two phases result, the brine can be doped with a paramagnetic ion such as $Mn^{++}$, to lower the relaxation times of the water protons. At higher concentrations of $Mn^{++}$ ($\sim$50 mM in $Mn^{++}$), the brine signal can be completely eliminated so that only the oil distribution is imaged.

An NMR Imager employed to measure petrophysical properties was a prototype built by Bruker Instruments, Inc. This system is based on a CXP-200 spectrometer console utilizing a 0.84 Tesla electromagnet ($^1$H resonant frequency of 35.6 MHz). Gradients of 1.4 KHz/mm may be produced in any two of the three orthogonal directions to generate projections. Normally, 120 projections were acquired for each orthogonal direction. The 90° pulse times of 8 $\mu$sec are produced with about 200 watts of RF power.

The sample diameter of this apparatus is limited to 4.2 cm or less by the size of the RF coil. RF field shaping is used for slice definition: the RF coil geometry is such that only a planar thickness of 1.5 cm is excited and detected. The slice thickness may be narrowed to about 1 mm by additional RF slice selection hardware. Images at different cross sections are obtained by moving the sample through the coil.

Raw data collection for a typical rock cross section takes approximately 5 minutes. The cross sectional image reconstruction is performed by a dedicated Aspect 2000A minicomputer interfaced to the NMR imager. After reconstruction, the images are stored on 1600 bpi magnetic tape and transferred to an IBM 4341 with Genisco color graphics display terminal. The Genisco has a display resolution of 640×512 with 256 discrete colors. A appropriate software package may then be employed which includes selectable color display, multiplanar image reconstruction from a series of cross sections, and M(0), $T_1$, and $T_2$ image processing as described hereinbefore.

Thus, the M(0) image represents the spatial pore space filled with fluid. This is equivalent to the spatial Free Fluid Index (FFI) of a sample. When only one fluid, such as water or brine, is present and the saturation of that fluid is known then the spatial porosity of the sample may be calculated.

However, if two fluids are present, such as brine and oil, the spatial FFI may again be directly measured from the M(0) image. Further, by doping the brine with enough concentration of a paramagnetic ion, as noted hereinbefore, only the oil is imaged and the residual oil saturation is then measured by the M(0) image after doping.

By allowing the doping ion to diffuse into the sample and imaging the sample during this diffusion process, it is also possible to determine the spatial formation factor.

The $T_2$ image as noted hereinbefore, is related to the pore size and/or shaliness of the sample. See Glasel, J. A. and Lee, K. A., Journal American Chemical Society, Vol. 96 (1974) p. 970 which indicates that $T_2$ decreased very rapidly with decreasing bead size (i.e. decreasing pore size) whereas $T_1$ decreased very slowly since $T_1$ is not affected by field inhomogenity but only by surface area and $T_2$ is affected by field inhomogenity and decreases substantially as the surface to volume ratio increases (i.e. decreasing pore size), and Pickett, A. G. and Lemcoe, M. M., Journal Geophysical Research, Vol. 64, No. 10 (1959) p. 1579, which indicates: The line width, a function of $T_2$, is measured as the width of the absorption curve at half amplitude, which is also the inflection point at which maximum slope is reached according to the relation (if the absorption curve is considered to be Lorentzian in shape) that the line width in cycles per second equals $[(3\pi)^{\frac{1}{2}}(T_2)]^{-1}$. The amount of water on the clay was determined by the ordinary soils-laboratory technique (oven drying and weighing) instead of from the NMR curves.

Clays were prepared at various moisture contents, and the line width of the derivative signal [equal to $1/(\sqrt{3\pi T_2})$] was measured and plotted as a function of moisture content. Stored at constant moisture content (in sealed bottles) the samples exhibited no change in the line width despite noticeable changes in strength properties (caused by thixotropic behavior and remolding) which resulted from quiescent aging for periods of as long as six months and from agitation.

Sodium montmorillonite has line widths of 1600 milligauss at 0.48 percent moisture content (based on oven-dry weight of the sample) and 950 milligauss at 3.46 percent.

The measurement of the viscosity of the liquid phase in various clays (at moisture contents from the oven-dry state to saturation), the inferences which may be drawn from the shape of the NMR derivative curve, and the plots of line width versus moisture content was thought to be worth-while contributions to the understanding of clay-water systems. These data provide an opportunity for the study of existing concepts of the clay-water system in the following respects.

The evidence of the derivative curve is that the water exists in a single bound state on clay.

The viscosity of the water (as measured by $T_2$ line width) at the clay surface is greater than that of the free water and that it decreases uniformly with increasing distance from the clay surface is clearly shown by the plots of line width versus moisture content; thus, the pore water has a narrow $T_2$ line width and the adsorbed water on the clay has a broader $T_2$ line width.

The $T_1$ image, with no dopant present, is related to the pore size and its distribution and may thus be used to calculate a capillary pressure curve, as noted in the Loren et al reference. From the capillary pressure curve the permeability may be calculated. The $T_1$ image with a dopant present is related only to the oil (if any) present and is a measure of the oil's viscosity.

Figure 4A:
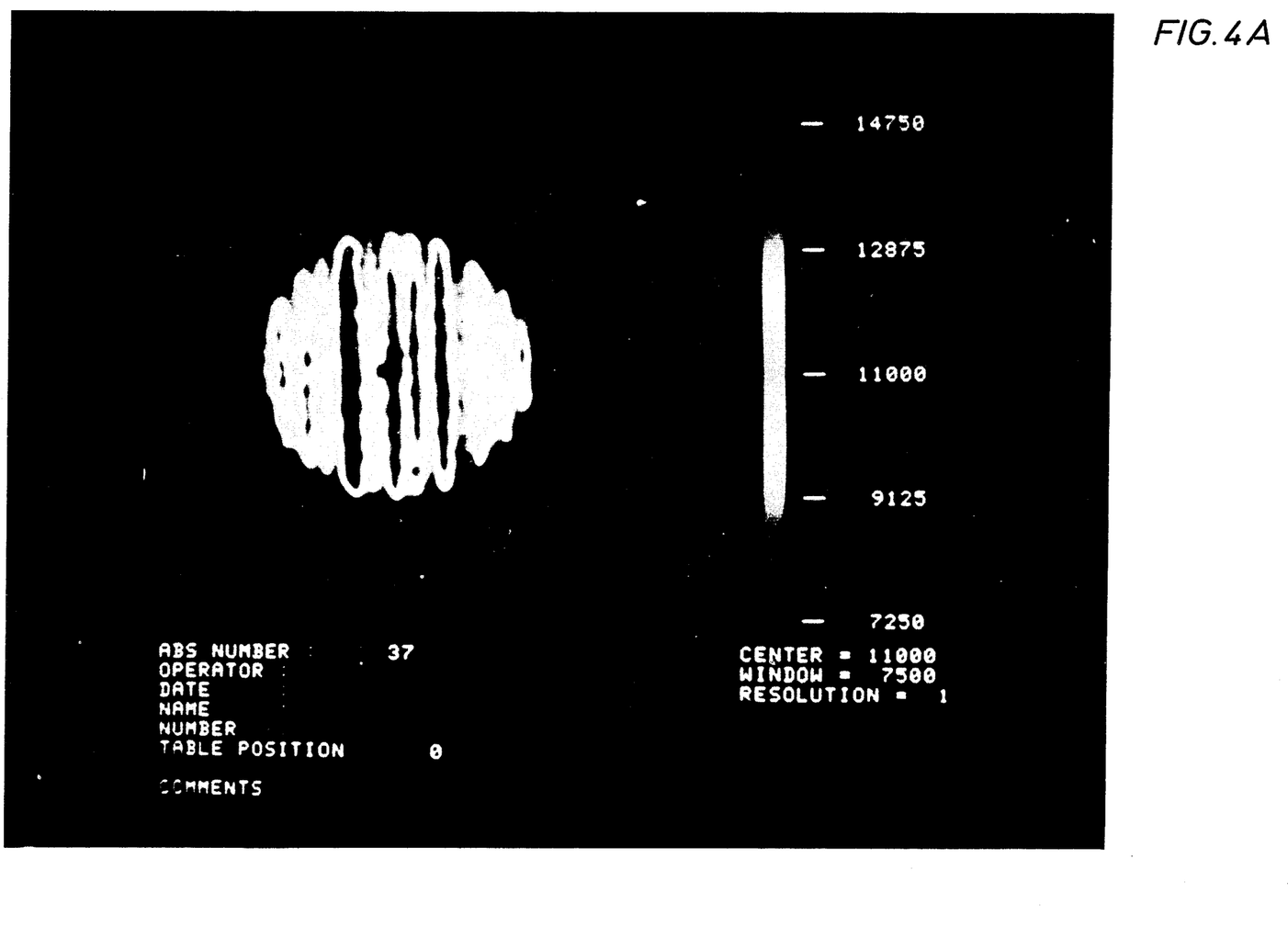
FIGS. 4A and B depict M(0) and $T_2$ images of a sandstone, respectively.
Figure 4B:
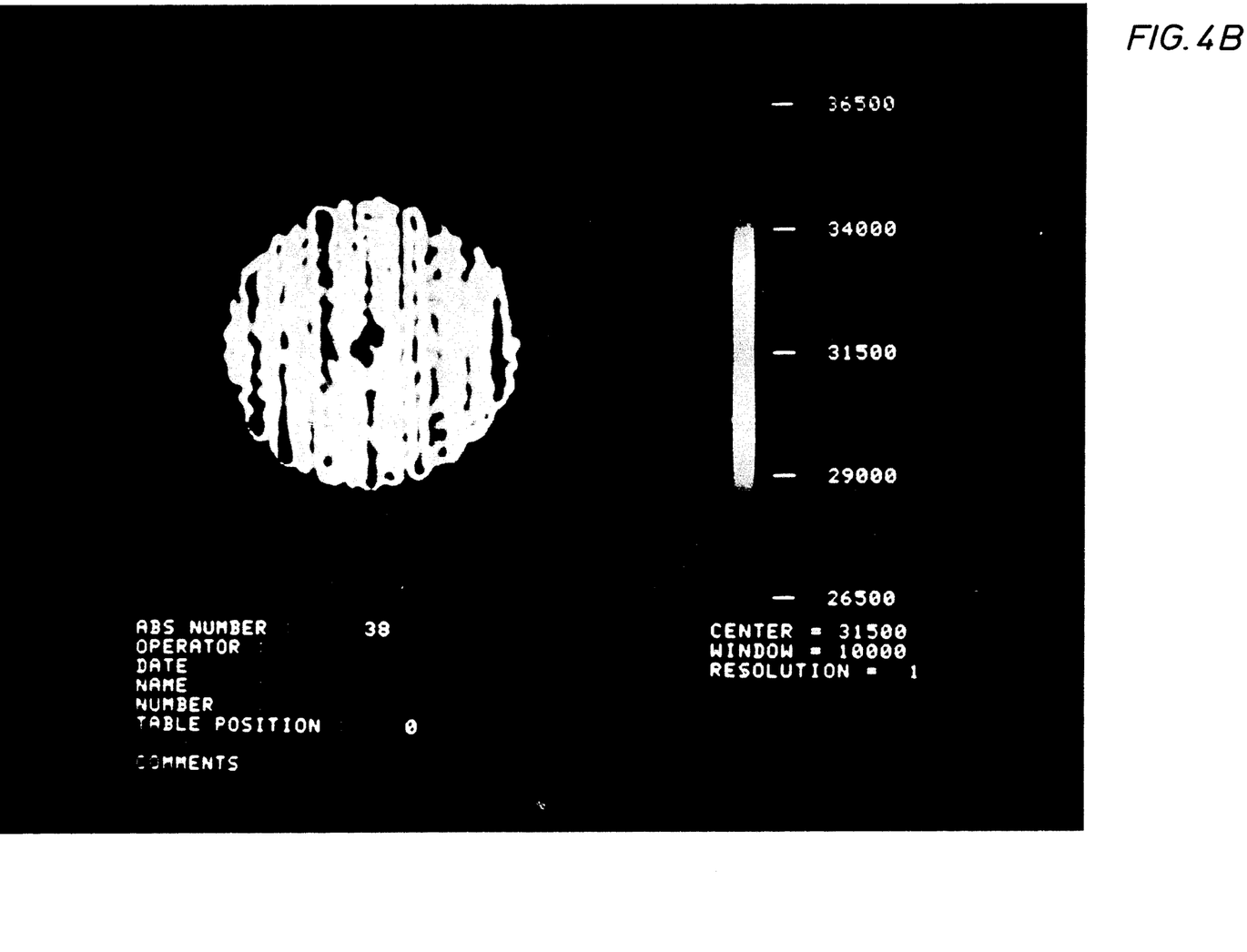

FIGS. 4(a) and 4(b) are the M(0) and $T_2$ images, respectively, for a 1" O.D. Berea sandstone saturated with 0.1N NaCl brine. The M(0) scale in FIG. 4(a) ranges from 12% porosity in the blue to 24% in the red spectrum. The $T_2$ scale in FIG. 4(b) ranges from 26.5 msec in the blue to 36.5 msec in the red spectrum.

Both M(0) and $T_2$ images show a series of vertically-oriented bedding planes which are barely visible on visual inspection. The M(0) image shows the bedding planes are associated with variations in fluid-filled porosity. The average cross sectional porosity determined by NMR is 18% in agreement with porosity determination by the conventional method of hydrostatic weighing in toluene. The large variations in porosity, from 12 to 24%, is surprising since Berea is normally thought to be a homogeneous sandstone. Bedding planes as fine as 1 mm are resolved in the cross section: no other technique has been able to resolve porosity differences on such a small scale.

The average $T_2$ in FIG. 4(b) is 32 msec. The longer $T_2$ values generally correspond to the more porous regions of the M(0) image, i.e. where there is more porosity, the pores are apparently large. However, note that the thin beds on the left and right hand sides of FIGS. 4(a) and 4(b) have lower porosity than the three center beds but longer $T_2$ relaxation times.

The NMR images show no evidence of radial intensity artifacts. This implies that (a) the RF attenuation is not significant at this frequency even though the sample contains a conductive brine and (b) the RF pulse power is adequate to cover the gradient-imposed frequency bandwidth. The low RF attenuation was expected since the low frequency resistivity of the specimen is 22 ohm-meters for which the penetration depth is about 0.8 meters, neglecting dielectric losses.

Figure 5A:
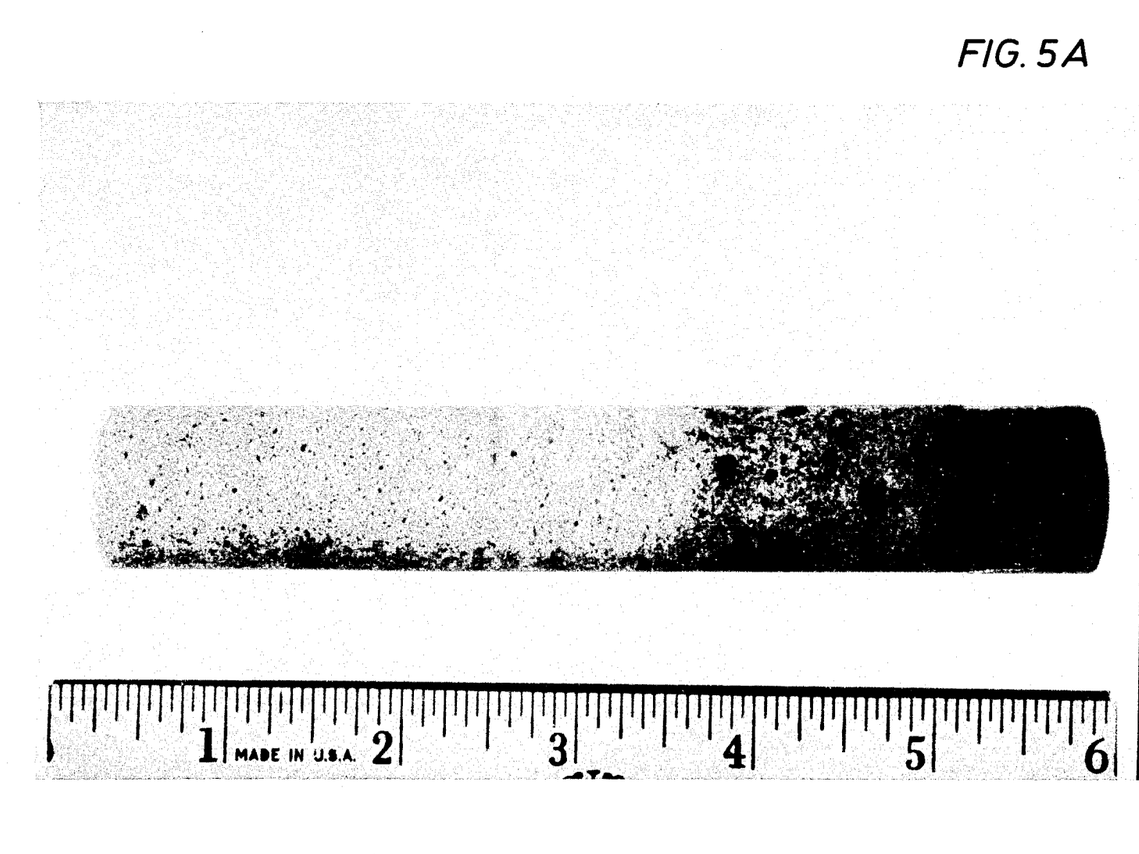
FIGS. 5A and B depict a core photograph and a reconstructed longitudinal image, respectively.
Figure 5B:
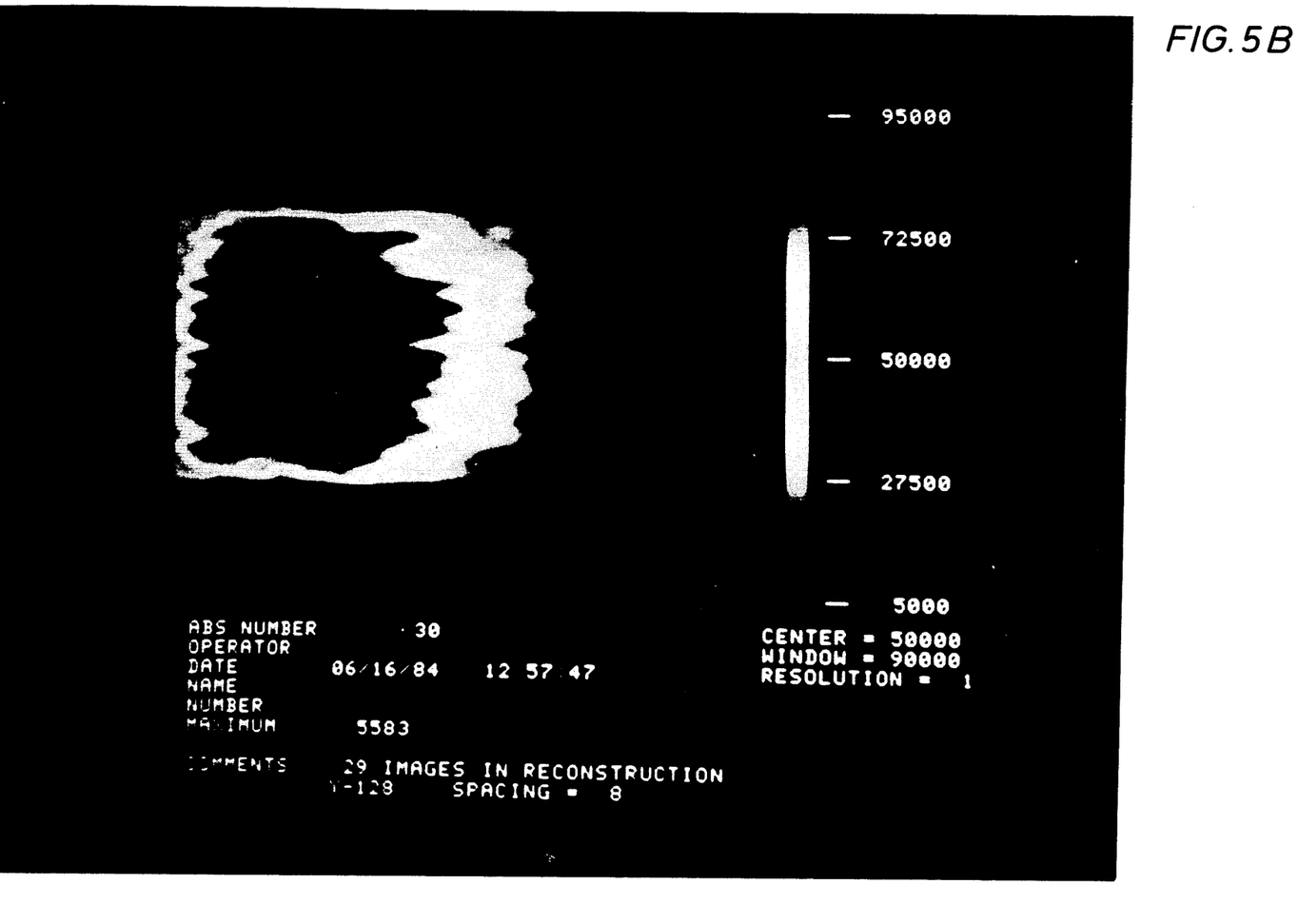

As an example of longitudinal image reconstruction, a plug 5¾" long×¾" O.D. was cut from a field core. The plug was selected form a section showing a sand/shale transition. As shown by the core photograph in FIG. 5(a), the sample consists of 3½" of clean sand on the left, followed by 1½" of sand conglomerate and ¾" of shale on the right. FIG. 5(b) is a longitudinal reconstruction derived from a series of 29 image cross sections taken at 0.5 cm spacings along the core. The 1.5 cm slice at the left hand edge is marred by a partial imaging of air.

The NMR image reveals a higher porosity in the clean sand as composed to the sand conglomerate. The reduced porosity of the sand conglomerate is caused by the large grains, visible in an optical photograph, but unresolved by the 1.5 cm NMR slice thickness. Only a slight difference in $T_2$ relaxation times was measured between the two sand zones, suggesting that wherever porosity exits, the pore sizes and clay contents are similar.

The shale zone does not appear in FIG. 5(b). The shale contributes no detectable NMR signal due to the extremely short $T_2$'s that arise from very small pore size and large clay content. Partial imaging of the shale region is responsible for the blue region in the sand conglomerate section.

Many other variations and modifications may be made in the apparatus and techniques hereinbefore described, by those having experience in this technology, without departing from the concept of the present invention. Accordingly, it should be clearly understood that the methods depicted in the accompanying drawings and referred to in the foregoing description are illustrative only and are not intended as limitations on the cope of the invention.

What is claimed is:

1. A method for obtaining at least one petrophysical property of a porous material containing therein at least one preselected fluid, comprising:
   NMR imaging said material to generate signals dependent upon both M(0) and $T_1$ and M(0) and $T_2$,
   generating separate M(0), $T_1$ and $T_2$ images from said signals, and
   determining said at least one petrophysical property from at least one of said images.

2. The method of claim 1, wherein said at least one petrophysical property comprises pore sizes and their distribution, and further comprising,
   decomposing said $T_1$, $T_2$, or both of said $T_1$ and $T_2$ signals into a plurality of respective $T_1$, $T_2$, or both $T_1$ and $T_2$, values and corresponding weighting coefficients, and
   determining pore sizes and distributions from said plurality of $T_1$, $T_2$, or both $T_1$ and $T_2$ values and weighting coefficients.

3. The method of claim 1, wherein said at least one petrophysical property comprises capillary pressure, and further comprising,
   decomposing said $T_1$, $T_2$, or both of said $T_1$ and $T_2$ signals into a plurality of respective $T_1$, $T_2$, or both $T_1$ and $T_2$ values and corresponding weighting coefficients,
   determining pore sizes and distributions from said plurality of $T_1$, $T_2$, or both $T_1$ and $T_2$ values and weighting coefficients, and
   determining said capillary pressure from said determined pore sizes and distributions.

4. The method of claim 1, wherein said at least one petrophysical property comprises permeability, and further comprising,
   decomposing said $T_1$, $T_2$, or both of said $T_1$ and $T_2$ signals into a plurality of respective $T_1$, $T_2$, or both $T_1$ and $T_2$ values and corresponding weighting coefficients,
   determining pore sizes and distributions from said plurality of $T_1$, $T_2$, or both $T_1$ and $T_2$ values and weighting coefficients,
   determining capillary pressure from said determined pore sizes and distributions, and
   determining permeability from said capillary pressure.

5. The method of claim 1, wherein said at least one petrophysical property comprises clay content, and further comprising,
   decomposing said $T_1$, $T_2$, or both of said $T_1$ and $T_2$ signals into a plurality of respective $T_1$, $T_2$, or both $T_1$ and $T_2$ values and corresponding weighting coefficients,
   determining pore sizes and distributions from said plurality of $T_1$, $T_2$, or both $T_1$ and $T_2$ values and weighting coefficients, and
   determining said clay content from said determined pore sizes and distributions and said values of $T_2$.

6. The method of claim 1, wherein said at least one petrophysical property comprises free fluid index, and further comprising,
   determining said free fluid index from at least one of said M(0) images.

7. The method of claim 1, wherein said at least one petrophysical property comprises porosity, and further comprising,
   determining an M(0) image of a calibration sample containing said at least one preselected fluid, and
   determining said porosity from at least one of said M(0) images and said calibration sample M(0) image.

8. The method of claim 1, wherein said at least one petrophysical property comprises formation factor, and further comprising,
   diffusing a paramagnetic ion into said fluid in said material during said imaging.

* * * * *